(12) United States Patent
Chan et al.

(10) Patent No.: US 10,121,889 B2
(45) Date of Patent: Nov. 6, 2018

(54) HIGH VOLTAGE SEMICONDUCTOR DEVICE

(71) Applicant: MACRONIX INTERNATIONAL CO., LTD., Hsinchu (TW)

(72) Inventors: Ching-Lin Chan, Yunlin County (TW); Cheng-Chi Lin, Yilan County (TW); Shyi-Yuan Wu, Hsinchu (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 209 days.

(21) Appl. No.: 14/472,529

(22) Filed: Aug. 29, 2014

(65) Prior Publication Data
US 2016/0064494 A1    Mar. 3, 2016

(51) Int. Cl.
| | | |
|---|---|---|
| H01L 29/739 | (2006.01) | |
| H01L 29/06 | (2006.01) | |
| H01L 29/423 | (2006.01) | |
| H01L 29/78 | (2006.01) | |
| H01L 29/66 | (2006.01) | |
| H01L 29/10 | (2006.01) | |

(52) U.S. Cl.
CPC ...... *H01L 29/7816* (2013.01); *H01L 29/0623* (2013.01); *H01L 29/1083* (2013.01); *H01L 29/1087* (2013.01); *H01L 29/66325* (2013.01); *H01L 29/66689* (2013.01); *H01L 29/7393* (2013.01); *H01L 29/063* (2013.01); *H01L 29/42368* (2013.01)

(58) Field of Classification Search
CPC ............. H01L 29/0623; H01L 29/1083; H01L 29/7816

USPC ........................................................ 438/202
See application file for complete search history.

(56) References Cited

U.S. PATENT DOCUMENTS

| 7,554,154 B2 | 6/2009 | Hebert |
| 7,667,268 B2 | 2/2010 | Disney et al. |

(Continued)

FOREIGN PATENT DOCUMENTS

| CN | 103745988 A | 4/2014 |
| TW | I350003 | 10/2011 |
| TW | I415262 B | 11/2013 |

OTHER PUBLICATIONS

Sedra, et al.: "Microelectronic Circuits"; 4th Edition, Oxford University Press; 1998; pp. 1-2.

(Continued)

*Primary Examiner* — Moazzam Hossain
*Assistant Examiner* — Hajar Kolahdouzan
(74) *Attorney, Agent, or Firm* — McClure, Qualey & Rodack, LLP

(57) ABSTRACT

A high voltage semiconductor device including a P type substrate, a high voltage N type well, a first P type well, a drift region, and a P type doping layer is provided. The high voltage N type well and the P type doping layer, which is formed in a region located below the first P type well and the drift region, are formed in the P type substrate. The first P type well is formed in the high voltage N type well. A bottom of the first P type well and a bottom of the P type doping layer are separated from a surface of the P type substrate by a first depth and a second depth larger than the first depth, respectively. The drift region is formed in the high voltage N type well and extending down from the surface of the P type substrate.

13 Claims, 12 Drawing Sheets

(56) References Cited

U.S. PATENT DOCUMENTS

2012/0241861 A1* 9/2012 Chen .................. H01L 29/0634
　　　　　　　　　　　　　　　　　　　　　　257/339
2012/0280316 A1　11/2012 Lin et al.
2014/0139282 A1* 5/2014 Yeh ...................... H01L 29/404
　　　　　　　　　　　　　　　　　　　　　　327/430

OTHER PUBLICATIONS

TW Office Action dated Sep. 21, 2016 in Taiwan application (No. 103126379.).
CN Office Action dated Sep. 26, 2017 in Chinese application (No. 201410383690.3).

* cited by examiner

HIGH VOLTAGE SEMICONDUCTOR DEVICE

BACKGROUND

Technical Field

The present disclosure relates in general to a high voltage semiconductor device, and more particularly to a high voltage semiconductor device having a high breakdown voltage and a low resistance.

Description of the Related Art

In recent decades, there is an ongoing drive toward the downscaling of dimensions of semiconductor structures while improving the speeds, efficiencies, densities and unit costs thereof simultaneously. For high voltage (HV) or Ultra high voltage (UHV) semiconductor device (such as metal-oxide-semiconductor (MOS) device), metal lines for connecting devices in silicon processes may induce the turn-on of parasitic field devices when these metal lines pass through specific regions. In other words, while MOSFETs are under high voltage operations, the maximum operating voltages thereof may be limited by turned on threshold voltages (Vth) of the parasitic field devices and might be lower than the breakdown voltages of MOSFETs.

However, there has been always a trade-off between these two important factors, the increase of the breakdown voltages and the decrease of the resistance. Therefore, researchers have been working on the manufactures of high voltage MOSFETs with high breakdown voltages and low resistances.

SUMMARY

The present disclosure is directed to a high voltage semiconductor device. In the embodiments, the P type doping layer is disposed in a region below the first P type well and the drift region, accordingly, the resistance of the high voltage semiconductor device can be decreased, and a high breakdown voltage can be maintained.

According to an embodiment of the present disclosure, a high voltage semiconductor device is provided. The high voltage semiconductor device includes a P type substrate, a high voltage N type well (HVNW), a first P type well, a drift region, and a P type doping layer. The high voltage N well is formed in the P type substrate. The first P type well is formed in the high voltage N type well. A bottom of the first P type well is separated from a surface of the P type substrate by a first depth. The drift region is formed in the high voltage N type well, wherein the drift region extends down from the surface of the P type substrate. The P type doping layer is formed in the P type substrate, and a bottom of the P type doping layer is separated from the surface of the P type substrate by a second depth, wherein the second depth is larger than the first depth, and the P type doping layer is formed in a region located below the first P type well and the drift region.

According to another embodiment of the present disclosure, a high voltage semiconductor device is provided. The high voltage semiconductor device includes a P type substrate, a high voltage N type well, a first P type well, a drift region, an N type heavily doping region, a P type heavily doping region, and a P type doping layer. The high voltage N well is formed in the P type substrate. The first P type well is formed in the high voltage N type well. A bottom of the first P type well is separated from a surface of the P type substrate by a first depth. The drift region is formed in the high voltage N type well, wherein the drift region extends down from the surface of the P type substrate. The N type heavily doping region and the P type heavily doping region are formed in the P type substrate. The N type heavily doping region is in the first P type well. The P type doping layer is formed in the P type substrate, and a bottom of the P type doping layer is separated from the surface of the P type substrate by a second depth, wherein the second depth is larger than the first depth, and the P type doping layer is formed in a region located below the first P type well and the drift region.

According to a further embodiment of the present disclosure, a high voltage semiconductor device is provided. The high voltage semiconductor device includes a P type substrate, a high voltage N type well, a first P type well, a drift region, an N type heavily doping region, a gate structure, and a P type doping layer. The high voltage N well is formed in the P type substrate. The first P type well is formed in the high voltage N type well. A bottom of the first P type well is separated from a surface of the P type substrate by a first depth. The drift region is formed in the high voltage N type well, wherein the drift region extends down from the surface of the P type substrate. The N type heavily doping region is formed in the first P type well. The gate structure is formed above the high voltage N type well, and the N type heavily doping region is electrically connected to the gate structure. The P type doping layer is formed in the P type substrate, and a bottom of the P type doping layer is separated from the surface of the P type substrate by a second depth, wherein the second depth is larger than the first depth, and the P type doping layer is formed in a region located below the first P type well and the drift region.

The above and other embodiments of the disclosure will become better understood with regard to the following detailed description of the non-limiting embodiment(s). The following description is made with reference to the accompanying drawings.

DETAILED DESCRIPTION

According to the embodiments of the present disclosure, a high voltage semiconductor device is provided. In the embodiments, the P type doping layer is disposed in a region below the first P type well and the drift region, accordingly, the resistance of the high voltage semiconductor device can be decreased, and a high breakdown voltage can be maintained. The following embodiments are for the purpose of elaboration only, not for limiting the scope of protection of the invention. Besides, secondary elements are omitted in the following embodiments to highlight the technical features of the invention.

Figure 1:
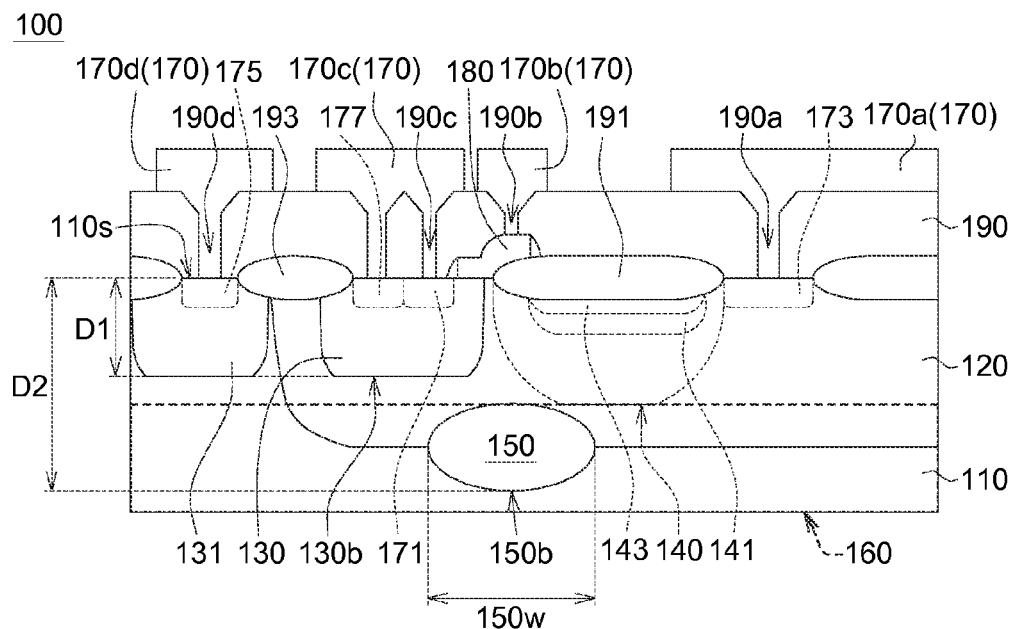
FIG. 1 shows a cross-sectional view of a high voltage semiconductor device according to an embodiment of the present disclosure.

FIG. 1 shows a cross-sectional view of a high voltage semiconductor device 100 according to an embodiment of the present disclosure. As shown in FIG. 1, the high voltage semiconductor device 100 includes a P type substrate 110, a high voltage N type well 120, a first P type well 130, a drift region 140, and a P type doping layer 150. The high voltage N type well 120 is formed in the P type substrate 110. The first P type well 130 is formed in the high voltage N type well 120. A bottom 130b of the first P type well 130 is separated from a surface 110s of the P type substrate 110 by a first depth D1. The drift region 140 is formed in the high voltage N type well 120, wherein the drift region 140 extends down from the surface 110s of the P type substrate 110. The P type doping layer 150 is formed in the P type substrate 110. A bottom 150b of the P type doping layer 150 is separated from the surface 110s of the P type substrate 110 by a second depth D2, which is larger than the first depth D1. The P type doping layer 150 is formed in a region 160 below the first P type well 130 and the drift region 140.

In the embodiment, the P type doping layer 150 is such as a P type buried layer.

Figure 8:
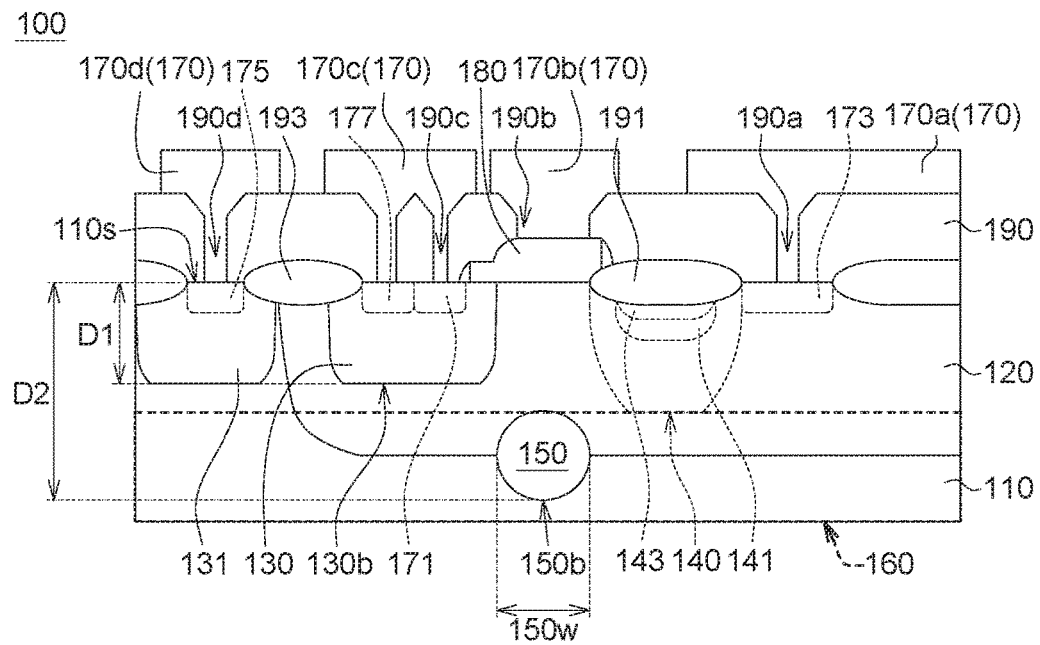
FIG. 8 shows a cross-sectional view of a high voltage semiconductor device according to a still further embodiment of the present disclosure.

In an embodiment, at least a portion of the P type doping layer 150 is located below the first P type well 130. In an embodiment, at least a portion of the P type doping layer 150 is located below the drift region 140. In an embodiment, the P type doping layer 150 is fully located below a middle region between the first P type well 130 and the drift region 140 and not located between any one of the first P type well 130 or the drift region 140, as shown in FIG. 8. In other words, the width 150 w of the P type doping layer 150 can be adjusted according to actual needs, such that the extending region along the width direction of the P type doping layer 150 may vary according to actual needs. For example, at least a portion of the P type doping layer 150 may be located only below the drift region 140 and not located below the first P type well 130 (not shown). Alternatively, at least a portion of the P type doping layer 150 may be located only below the P type well 130 and not located below the drift region 140 (not shown). In the present embodiment, as shown in FIG. 1, the P type doping layer 150 is located below the first P type well 130 and the drift region 140.

In the embodiment, as shown in FIG. 1, the high voltage semiconductor device 100 may further include a source region 171 and a drain region 173. The source region 171 and the drain region 173 are formed in the P type substrate 110. In the embodiment, as shown in FIG. 1, the source region 171 is located in the first P type well 130, and a current path is formed between the source region 171 and the drain region 173. In the embodiment, the source region 171 and the drain region 173 are such as N type heavily doping regions.

Generally speaking, it is relatively more difficult to achieve fully depletion in the source region of a high voltage device. According to an embodiment of the present disclosure, the P type doping layer 150 is located below the source region 171, such that an improved depletion may be achieved for the source region 171; accordingly, the high voltage semiconductor device 100 may be provided with a higher breakdown voltage with a lower resistance when the high voltage semiconductor device 100 is turned on.

In the embodiment, as shown in FIG. 1, the high voltage semiconductor device 100 may further include a P type heavily doping region 177, which is formed in the first P type well 130 and located adjacent to the source region 171.

In the embodiment, as shown in FIG. 1, the high voltage semiconductor device 100 may further include a gate structure 180, which is formed above the current path between the source region 171 and the drain region 173. In the embodiment, the gate structure 180 may include, for example, a polysilicon layer and a tungsten silicide layer formed on the polysilicon layer.

In the embodiment, the high voltage semiconductor device 100 may further include a field oxide (FOX). As shown in FIG. 1, the field oxide layer 191 is disposed on the drift region 140 and located between the source region 171 and the drain region 173. In the embodiment, the field oxide is such as silicon dioxide.

In the embodiment, as shown in FIG. 1, the high voltage semiconductor device 100 may further include a second P type well 131 and a bulk region 175. The second P type well 131 is formed in the P type substrate 110 and located adjacent to the high voltage N type well 120. The bulk region 175 is formed in the second P type well 131. In the embodiment, the bulk region 175 is such as a P type heavily doping region. In the embodiment, as shown in FIG. 1, the high voltage semiconductor device 100 may further include a field oxide layer 193, which is disposed between the first P type well 130 and the second P type well 131.

In the embodiment, as shown in FIG. 1, the high voltage semiconductor device 100 may further include a P type top doping layer 141 and an N type doping layer 143. The P type top doping layer 141 is formed in the high voltage N type well 120 and corresponding to where the drift region 140 is located at. The N type doping layer 143 is formed in the P type top doping layer 141. In the embodiment, the doping concentrations of the P type top doping layer 141 and the N type doping layer 143 are higher than the doping concentrations of the first P type well 130 and the second P type well 131. Moreover, the doping concentrations of the first P type well 130 and the second P type well 131 are higher than that of the high voltage N type well 120.

In the embodiment, when the amount of carriers of the P type doping regions (the first P type well 130, the P type top doping layer 141, and the P type doping layer 150) are about equivalent to the amount of carriers of the N type doping regions (the high voltage N type well 120 and the N type doping layer 143), an improved depletion is achieved, resulting in a higher breakdown voltage of the high voltage semiconductor device 100. Meanwhile, the P type doping layer 150 is disposed for dispersing and lowering the amount of carriers of the other P type doping regions (the first P type well 130, and the P type top doping layer 141), such that the depletion of the source region 171 and the drift region 140 is improved, and the resistance of the high voltage semiconductor device 100 is lowered when turned on.

Specifically speaking, the P type doping layer 150 is disposed for lowering the amount of carriers of the first P type well 130 and the P type top doping layer 141. In other words, the amount of carriers of the other P type doping regions (the first P type well 130, and the P type top doping layer 141) is lowered, which indicates that the concentration of carriers of the current path between the source region 171 and the drain region 173 is lowered; accordingly, the high voltage semiconductor device 100 may have a lower resistance when turned on. Furthermore, the P type doping layer 150 is disposed in the region 160 below the first P type well 130 and the drift region 140. In view of the above, the doping concentration of the P type doping layer 150 is relevant to the position and range it occupies and is not limited to any specific ranges, as long as the above-mentioned functions are achieved.

In the embodiment, as shown in FIG. 1, the high voltage semiconductor device 100 may further include a dielectric structure 190 and a patterned metal layer 170. The dielectric structure 190 is formed on the P type substrate 110. In the present embodiment, as shown in FIG. 1, the metal patterns 170a, 170b, 170c, and 170d of the patterned metal layer 170 go through the contact holes 190a, 190b, 190c, and 190d of the dielectric structure 190, respectively, for electrically connecting to the drain region 173, the gate structure 180, the source region 171, and the bulk region 175, respectively. In the present embodiment, the metal patterns 170a, 170b, 170c, and 170d are electrically isolated from one another. In the embodiment, the dielectric structure 190 is such as an interlayer dielectric layer. However, the selections of the numbers of the metal patterns and the contact holes may vary depending on the actual needs and are not limited to the numbers illustrated in the embodiments.

In the embodiment as shown in FIG. 1, the high voltage semiconductor device 100 is such as a high voltage N type metal-oxide semiconductor (NMOS) device.

Figure 2:
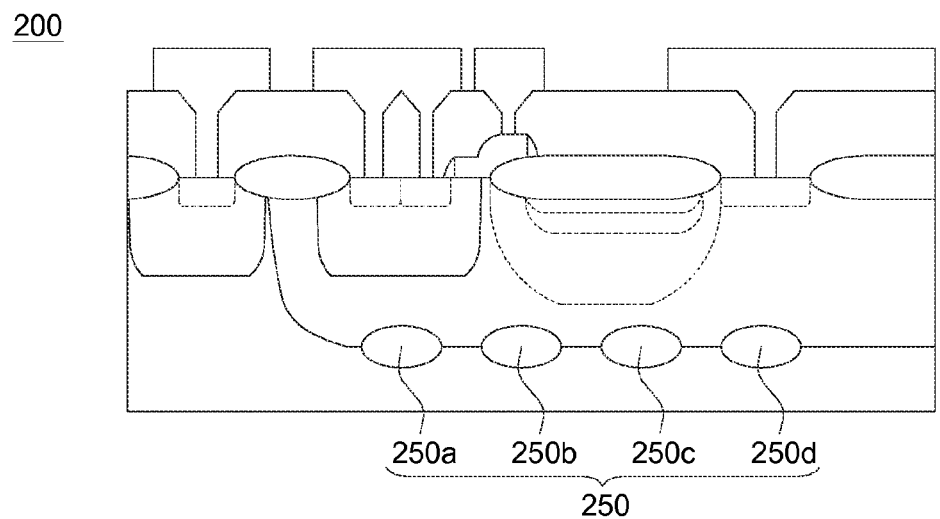
FIG. 2 shows a cross-sectional view of a high voltage semiconductor device according to another embodiment of the present disclosure.

FIG. 2 shows a cross-sectional view of a high voltage semiconductor device 200 according to another embodiment of the present disclosure. The elements in the present embodiment sharing the same labels with those in the previous embodiment are the same elements, and the description of which is omitted.

As shown in FIG. 2, in the high voltage semiconductor device 200, the P type doping layer 250 may include a plurality of P type doping segments 250a, 250b, 250c, and 250d. The P type doping segments 250a, 250b, 250c, and 250d are separated from one another.

Figure 3:
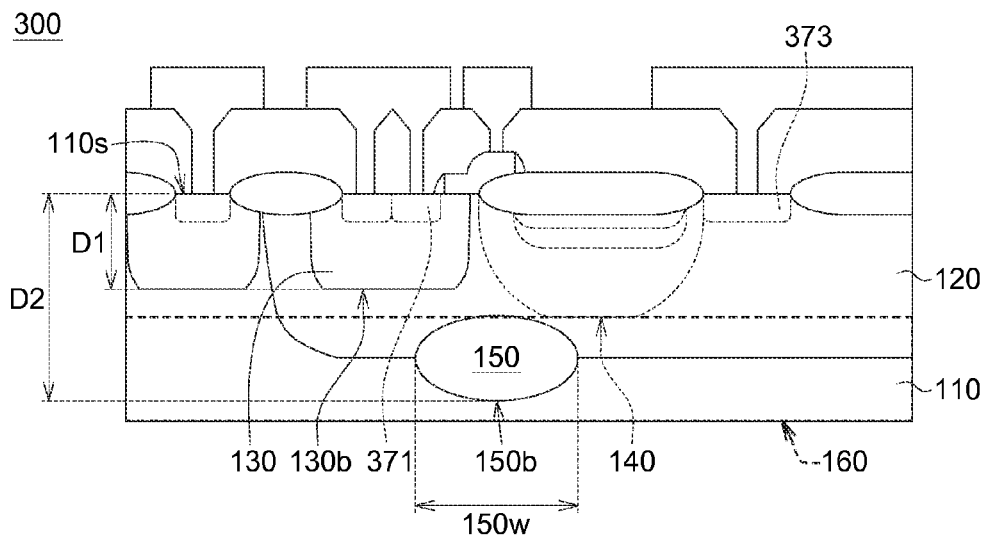
FIG. 3 shows a cross-sectional view of a high voltage semiconductor device according to a further embodiment of the present disclosure.

FIG. 3 shows a cross-sectional view of a high voltage semiconductor device 300 according to a further embodiment of the present disclosure. The elements in the present embodiment sharing the same labels with those in the previous embodiment are the same elements, and the description of which is omitted.

As shown in FIG. 3, the high voltage semiconductor device 300 includes the P type substrate 110, the high voltage N type well 120, the first P type well 130, the drift region 140, an N type heavily doping region 371, a P type heavily doping region 373, and the P type doping layer 150. The high voltage N type well 120 is formed in the P type substrate 110. The first P type well 130 is formed in the high voltage N type well 120. The bottom 130b of the first P type well 130 is separated from the surface 110s of the P type substrate 110 by the first depth D1. The drift region 140 is formed in the high voltage N type well 120, wherein the drift region 140 extends down from the surface 110s of the P type substrate 110. The N type heavily doping region 371 and the P type heavily doping region 373 are formed in the P type substrate 110, and the N type heavily doping region 371 is formed in the first P type well 130. The P type doping layer 150 is formed in the P type substrate 110. The bottom 150b of the P type doping layer 150 is separated from the surface 110s of the P type substrate 110 by the second depth D2, which is larger than the first depth D1. The P type doping layer 150 is formed in the region 160 below the first P type well 130 and the drift region 140.

Figure 9:
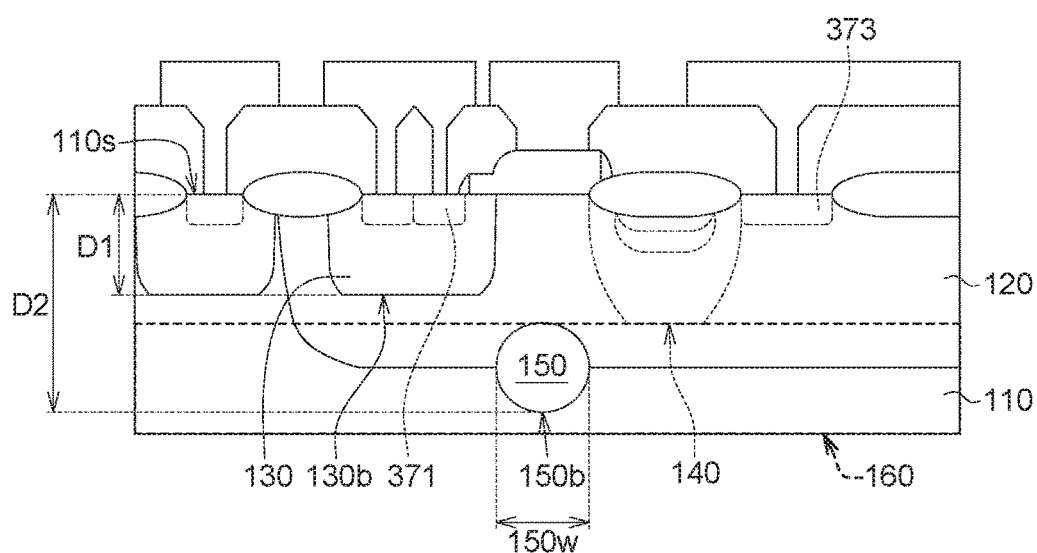
FIG. 9 shows a cross-sectional view of a high voltage semiconductor device according to a still further embodiment of the present disclosure.

In an embodiment, at least a portion of the P type doping layer 150 is located below the first P type well 130. In an embodiment, at least a portion of the P type doping layer 150 is located below the drift region 140. In an embodiment, the P type doping layer 150 is fully located below the middle region between the first P type well 130 and the drift region 140 and not located between any one of the first P type well 130 or the drift region 140, as shown in FIG. 9. In other words, the width 150w of the P type doping layer 150 can be adjusted according to actual needs, such that the extending region along the width direction of the P type doping layer 150 may vary according to actual needs. For example, at least a portion of the P type doping layer 150 may be located only below the drift region 140 and not located below the first P type well 130 (not shown). Alternatively, at least a portion of the P type doping layer 150 may be located only below the P type well 130 and not located below the drift region 140 (not shown). In the present embodiment, as shown in FIG. 3, the P type doping layer 150 is located below the first P type well 130 and the drift region 140.

In other embodiments, the P type doping layer 150 may also include a plurality of P type doping segments, and these P type doping segments are separated from one another (not shown).

In the embodiment as shown in FIG. 3, the high voltage semiconductor device 300 is such as a high voltage insulated gate bipolar transistor (IGBT).

Figure 4:
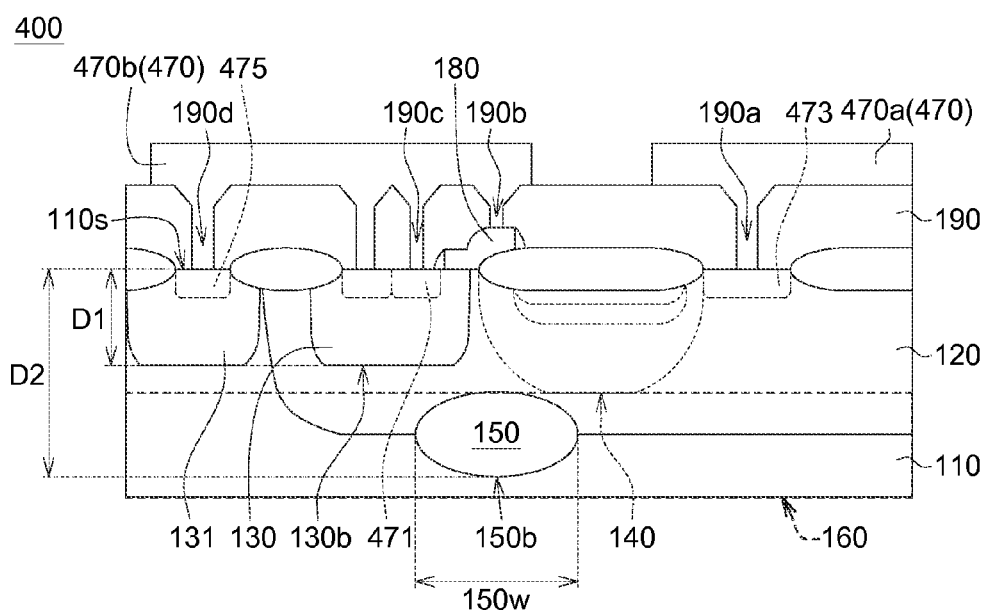
FIG. 4 shows a cross-sectional view of a high voltage semiconductor device according to a still further embodiment of the present disclosure.

FIG. 4 shows a cross-sectional view of a high voltage semiconductor device 400 according to a still further embodiment of the present disclosure. The elements in the present embodiment sharing the same labels with those in the previous embodiment are the same elements, and the description of which is omitted.

As shown in FIG. 4, the high voltage semiconductor device 400 includes the P type substrate 110, the high voltage N type well 120, the first P type well 130, the drift region 140, an N type heavily doping region 471, the gate structure 180, and the P type doping layer 150. The high voltage N type well 120 is formed in the P type substrate 110. The first P type well 130 is formed in the high voltage N type well 120. The bottom 130b of the first P type well 130 is separated from the surface 110s of the P type substrate 110 by the first depth D1. The drift region 140 is formed in the high voltage N type well 120, wherein the drift region 140 extends down from the surface 110s of the P type substrate 110. The N type heavily doping region 471 is formed in the first P type well 130. The gate structure 180 is formed above the high voltage N type well 120, and the N type heavily doping region 471 is electrically connected to the gate structure 180. The P type doping layer 150 is formed in the P type substrate 110. The bottom 150b of the P type doping layer 150 is separated from the surface 110s of the P type substrate 110 by the second depth D2, which is larger than the first depth D1. The P type doping layer 150 is formed in the region 160 below the first P type well 130 and the drift region 140.

In the embodiment, the high voltage semiconductor device 400 may further include an N type heavily doping region 473, a P type heavily doping region 475, the dielectric structure 190, and at least a patterned metal layer 470. The dielectric structure 190 is formed on the P type substrate 110. In the present embodiment, as shown in FIG. 4, the metal pattern 470*a* of the patterned metal layer 470 goes through the contact hole 190*a* of the dielectric structure for electrically connecting to the N type heavily doping region 473. The N type heavily doping region 471, the P type heavily doping region 475, and the gate structure 180 are electrically connected to the metal pattern 470*b* through the contact holes 190*b*, 190*c*, and 190*d* of the dielectric structure 190. In the present embodiment, the metal patterns 470*a* and 47*b* are such as electrically isolated from each other. In the embodiment, the dielectric structure 190 is such as an interlayer dielectric layer. However, the numbers of the metal patterns and the contact holes may vary according to actual needs and are not limited thereto.

Figure 10:
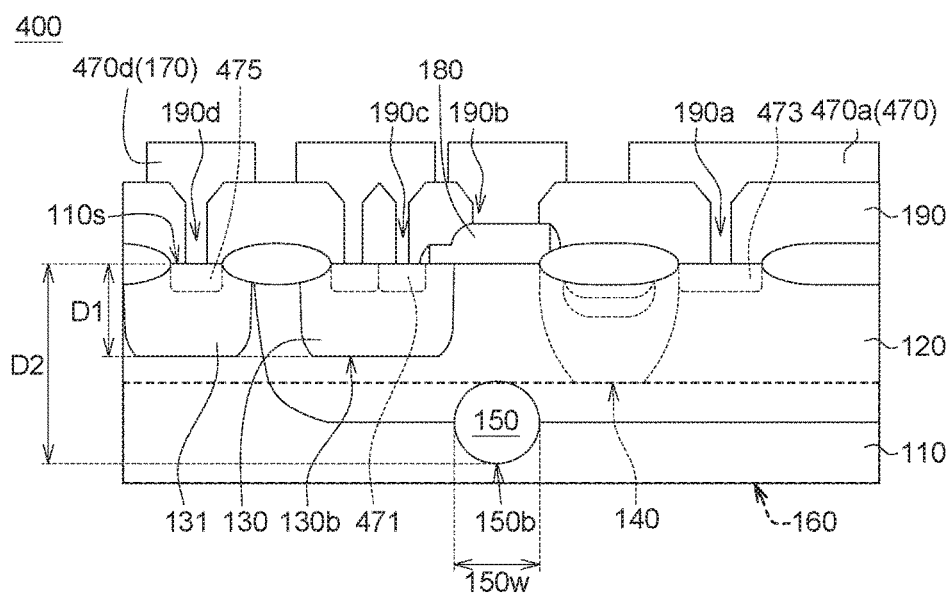
FIG. 10 shows a cross-sectional view of a high voltage semiconductor device according to a still further embodiment of the present disclosure.

In an embodiment, at least a portion of the P type doping layer 150 is located below the first P type well 130. In an embodiment, at least a portion of the P type doping layer 150 is located below the drift region 140. In an embodiment, the P type doping layer 150 is fully located below the middle region between the first P type well 130 and the drift region 140 and not located between any one of the first P type well 130 or the drift region 140, as shown in FIG. 10. In other words, the width 150*w* of the P type doping layer 150 can be adjusted according to actual needs, such that the extending region along the width direction of the P type doping layer 150 may vary according to actual needs. For example, at least a portion of the P type doping layer 150 may be located only below the drift region 140 and not located below the first P type well 130 (not shown). Alternatively, at least a portion of the P type doping layer 150 may be located only below the P type well 130 and not located below the drift region 140 (not shown). In the present embodiment, as shown in FIG. 4, the P type doping layer 150 is located below the first P type well 130 and the drift region 140.

In other embodiments, the P type doping layer 150 may also include a plurality of P type doping segments, and these P type doping segments are separated from one another (not shown).

In the embodiment as shown in FIG. 4, the high voltage semiconductor device 400 is such as a high voltage diode device.

Figure 5:
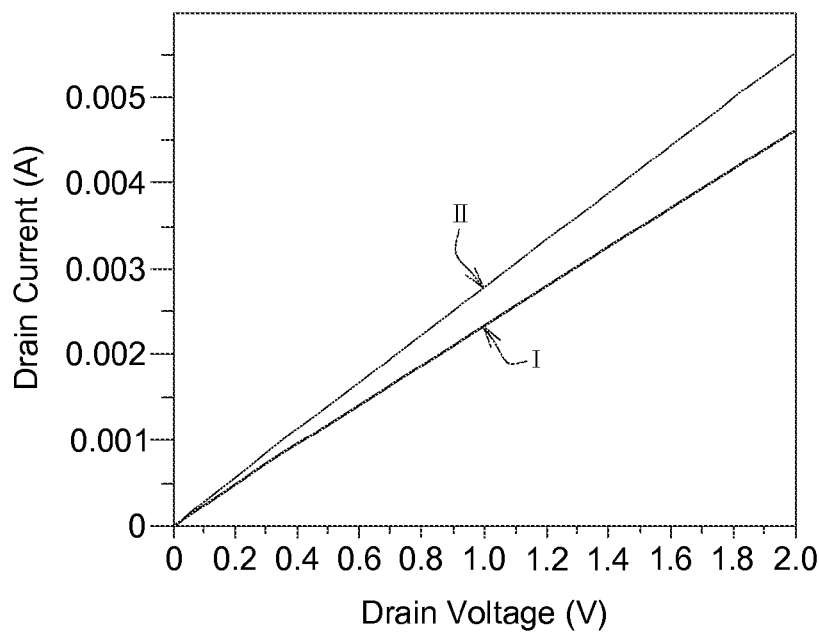
FIG. 5 shows I-V curves of high voltage semiconductor devices according to a comparative embodiment and an embodiment of the present disclosure.
Figure 6:
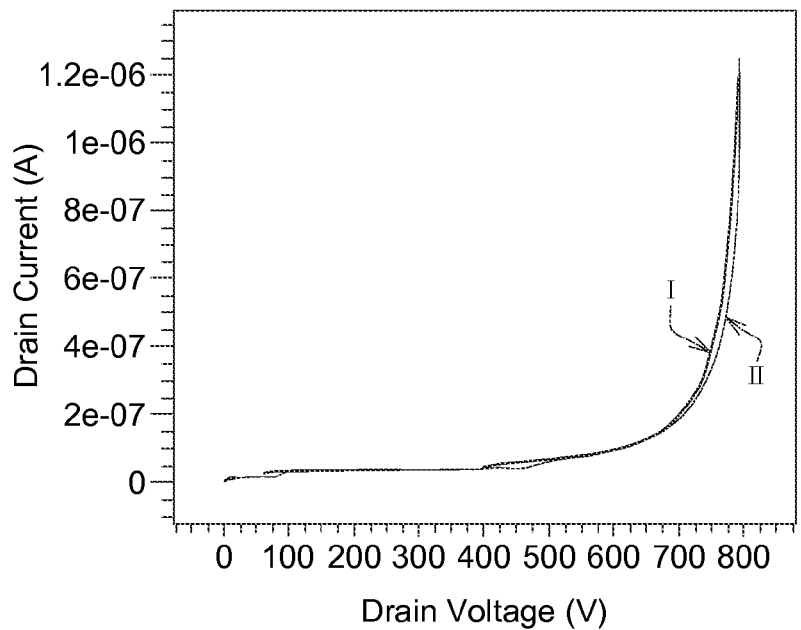
FIG. 6 shows another I-V curves of high voltage semiconductor devices according to a comparative embodiment and an embodiment of the present disclosure.

FIGS. 5-6 show I-V curves of high voltage semiconductor devices according to a comparative embodiment and an embodiment of the present disclosure. The high voltage semiconductor device 100 is taken as the example. In FIG. 5, the drain voltage (Vd) is 0-2V, and the gate voltage (Vgs) is 20V. In FIG. 6, the drain voltage (Vd) is 0-800V, and the gate voltage (Vgs) and the bulk voltage (Vbs) are both 0V. Curve I represents the I-V curve of the high voltage semiconductor device of the comparative embodiment, wherein the high voltage semiconductor device of the comparative embodiment does not include the P type doping layer 150. Curve II represents the I-V curve of the high voltage semiconductor device 100 of the embodiment.

As shown in FIG. 5, the current of the high voltage semiconductor device 100 of the embodiment is higher than that of the high voltage semiconductor device of the comparative embodiment at a drain voltage (Vd) of, for example, 1V, where the current is increased by about 16%. It indicates that the high voltage semiconductor device 100 has a lower resistance when turned on. Moreover, as shown in FIG. 6, both of the high voltage semiconductor device 100 of the embodiment and the high voltage semiconductor device of the comparative embodiment have breakdown voltages of at least higher than 750V, which shows that disposing the P type doping layer 150 in the high voltage semiconductor device 100 does not cause any decreased of the breakdown voltage. In other words, according to the embodiments of the present disclosure, the high voltage semiconductor device 100 has a high breakdown voltage and low resistance when turned on.

A manufacturing method of a high voltage semiconductor device of an embodiment is disclosed below. However, the procedures of the method are for detailed descriptions only, not for limiting the scope of protection of the invention. Anyone who is skilled in the technology of the invention will be able to modify or adjust the procedures to meet actual needs in practical applications. It is to be noted that some of the elements in the drawings are shown in perspective view, and some secondary elements are omitted for highlighting the technical features of the disclosure.

Figure 7A:
FIGS. 7A-7N illustrate a manufacturing method of a high voltage semiconductor device according to an embodiment of the disclosure.
Figure 7B:
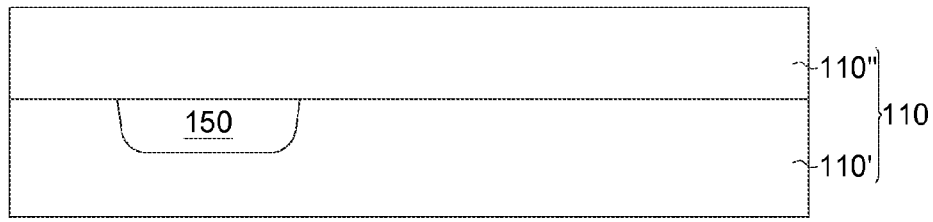
Figure 7C:
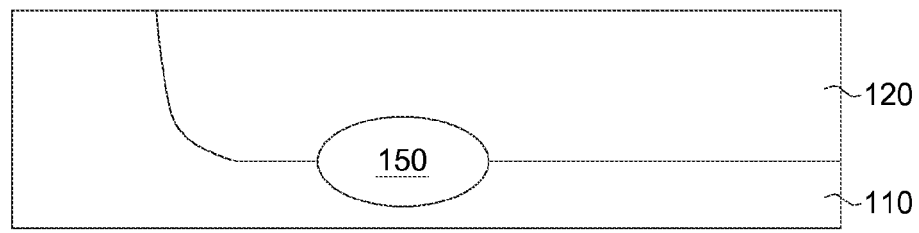
Figure 7D:
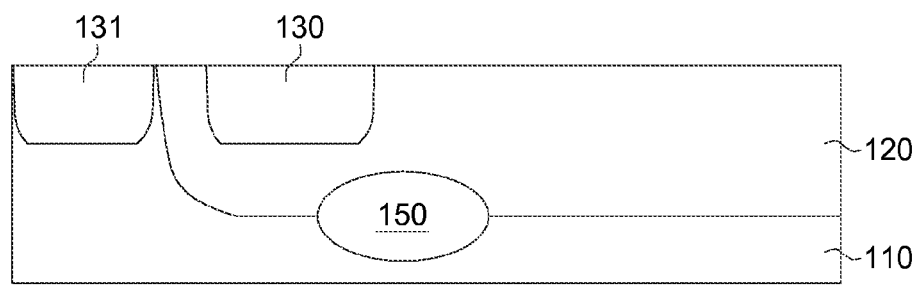
Figure 7E:
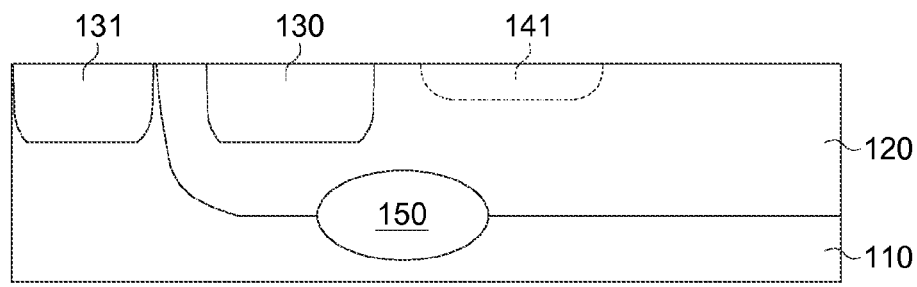
Figure 7F:
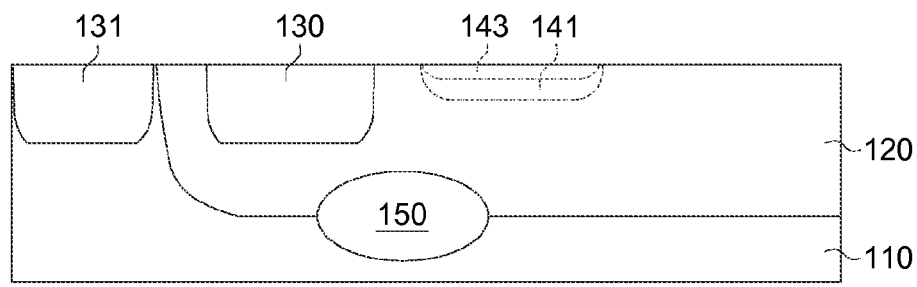
Figure 7G:
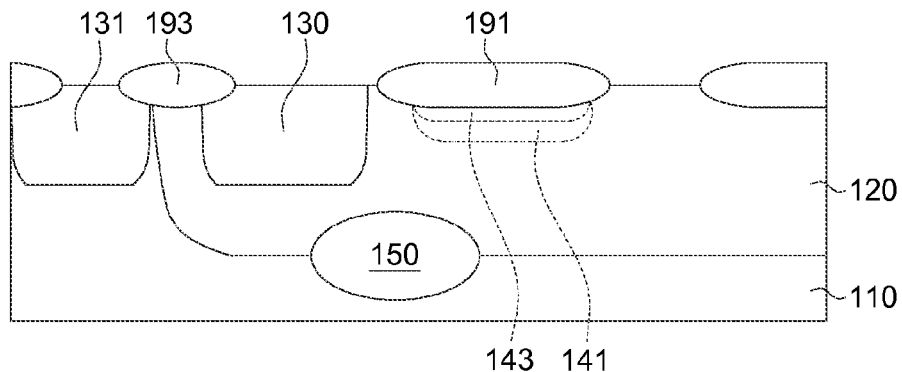
Figure 7H:
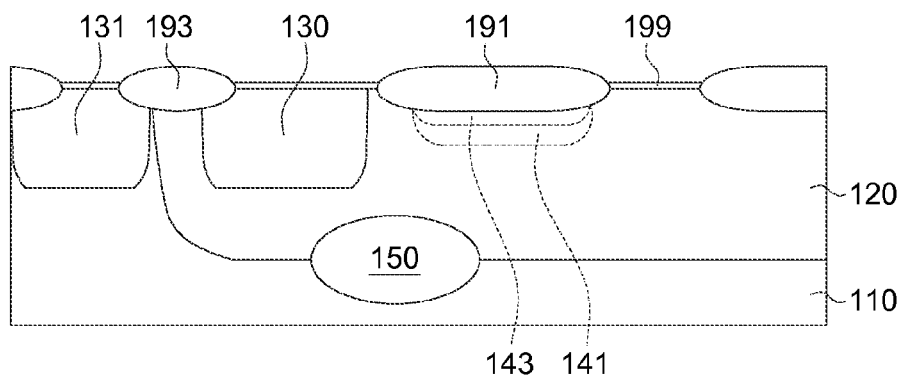
Figure 7I:
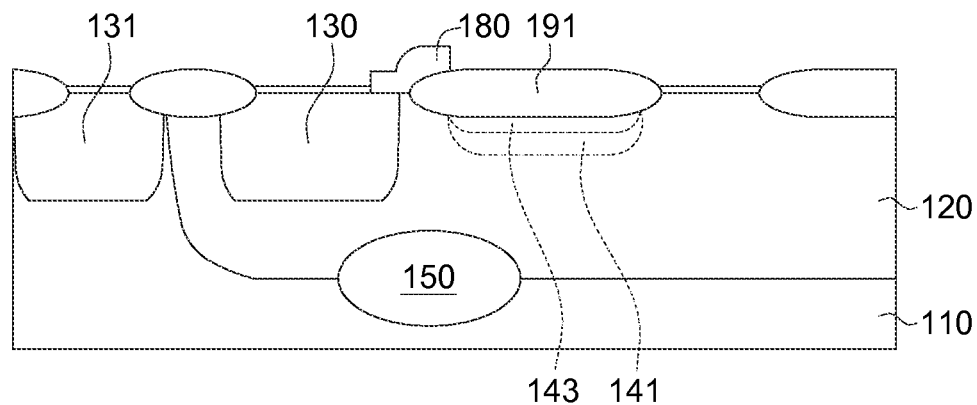
Figure 7J:
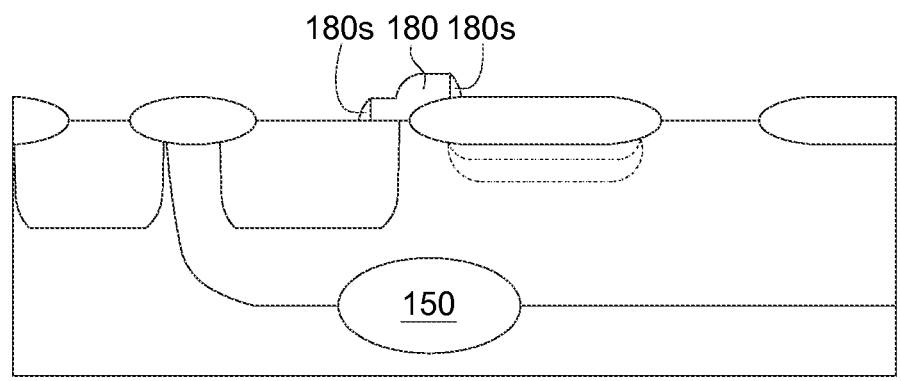
Figure 7K:
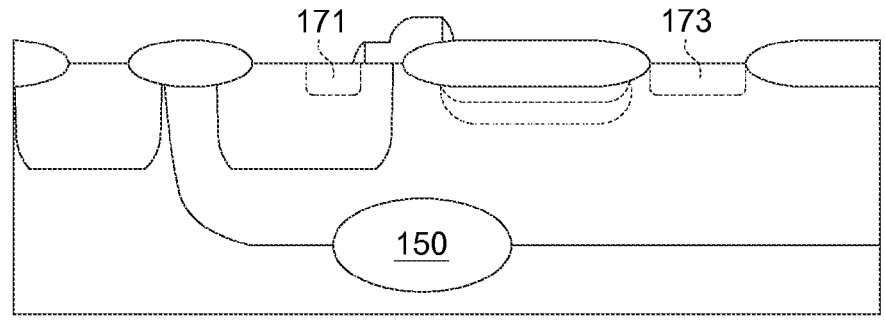
Figure 7L:
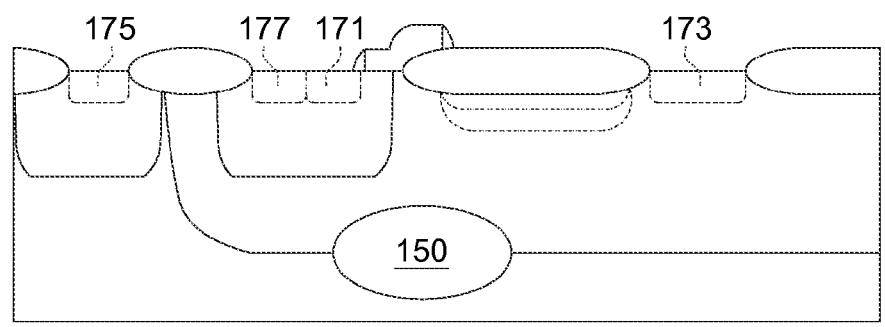
Figure 7M:
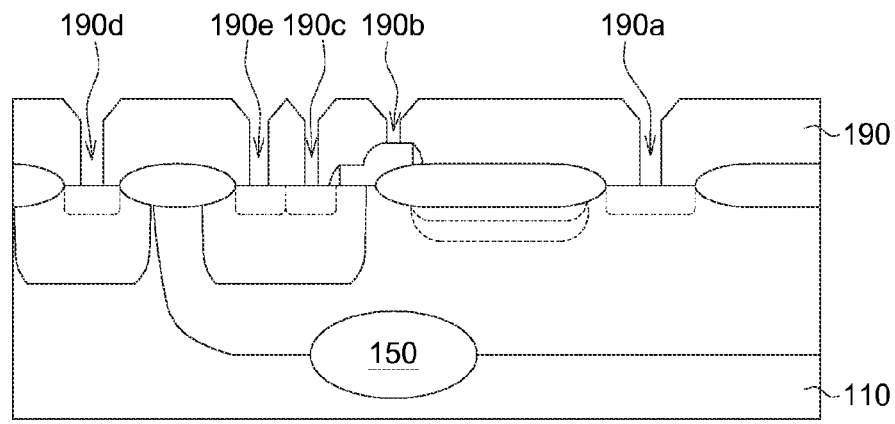
Figure 7N:
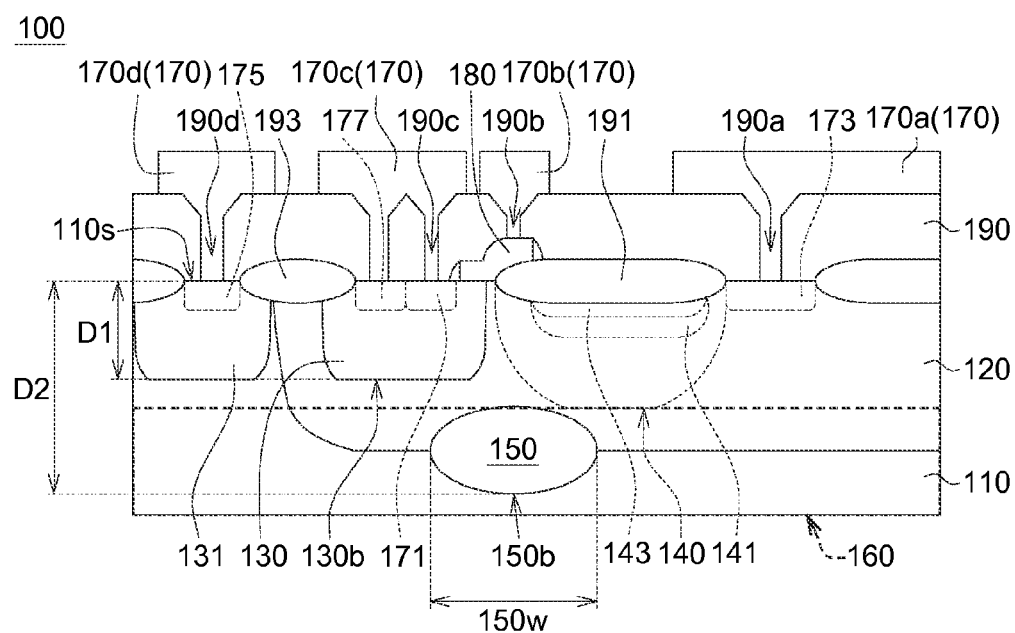

FIGS. 7A-7N illustrate a manufacturing method of the high voltage semiconductor device 100 according to an embodiment of the disclosure. Please refer to FIGS. 7A-7N.

As shown in FIG. 7A, a P type substrate 110' is provided, and the P type doping layer 150 is formed in the P type substrate 110'. In the embodiment, the P type doping layer 150 is formed by such as an implantation process. The P type doping layer 150 is such as a P+ buried layer.

As shown in FIG. 7B, a P type epitaxial layer 110" is formed on the P type substrate 110' by an epitaxial process for forming the P type substrate 110.

As shown in FIG. 7C, the high voltage N type well 120 is formed in the P type substrate 110.

As shown in FIG. 7D, the first P type well 130 is formed in the high voltage N type well 120, and the second P type well 131 is formed in the P type substrate 110 and located adjacent to the high voltage N type well 120.

As shown in FIG. 7E, the P type top doping layer 141 is formed in the high voltage N type well 120.

As shown in FIG. 7F, the N type doping layer 143 is formed in the P type top doping layer 141.

As shown in FIG. 7G, field oxide layers are formed for defining the predetermined active regions. In the embodiment, for example, the field oxide layer 191 is disposed on the N type doping layer 143, and the field oxide layer 193 is disposed between the first P type well 130 and the second P type well 131.

As shown in FIG. 7H, an oxide layer 199 is formed on the surfaces of the predetermined active regions. The oxide layer 199 would function as the gate oxide layer. It is to be noted that the oxide layer 199 is not shown in FIGS. 1-4.

As shown in FIG. 7I, the gate structure 180 is formed between the first P type well 130 and the N type doping layer 143 and across a portion of the field oxide layer 191. In the embodiment, the gate structure 180 is actually formed above the current path between the to-be-formed source region and drain region. In the embodiment, a polysilicon layer may be formed, followed by the formation of a tungsten silicide layer on the polysilicon layer.

As shown in FIG. 7J, spacers 180*s* are formed on two sides of the gate structure 180. It is to be noted that the spacers 180*s* are not shown in FIG. 104.

As shown in FIG. 7K, an implantation process is performed for forming the source region 171 in the first P type well 130 and the drain region 173 in the high voltage N type well 120. In the embodiment, the source region 171 and the drain region 173 are such as N type heavily doping regions.

As shown in FIG. 7L, an implantation process is performed for forming the bulk region 175 in the second P type well 131. In the embodiment, the bulk region 175 is such as a P type heavily doping region. In the present implantation process, the P type heavily doping region 177 may be formed simultaneously in the first P type well 130 and adjacent to the source region 171.

As shown in FIG. 7M, the dielectric structure 190 is formed on the P type substrate 110. In the embodiment, the dielectric structure 190 may be formed with a plurality of contact holes, for example, the contact holes 190a, 190b, 190c, 190d, and 190e. Each of the contact holes is corresponding to a region predetermined to electrically connect to the patterned metal layer, which will be formed in the following step.

As shown in FIG. 7N, the patterned metal layer 170 is formed. In the embodiment, the patterned metal layer 170 is formed with metal patterns 170a, 170b, 170c, and 170d, which are electrically connected to the drain region 173, the gate structure 180, the source region 171, and the bulk region 175, respectively, through the contact holes 190a, 190b, 190c, and 190d of the dielectric structure 190. As such, the high voltage semiconductor device 100 is formed.

While the disclosure has been described by way of example and in terms of the exemplary embodiment(s), it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A high voltage semiconductor device, comprising:
a P type substrate;
a high voltage N type well formed in the P type substrate;
a first P type well formed in the high voltage N type well, a bottom of the first P type well being separated from a surface of the P type substrate by a first depth;
a source region and a drain region formed in the P type substrate, the source region is in the first P type well;
a field oxide formed on the P type substrate and located between the source region and the drain region;
a drift region formed in the high voltage N type well, wherein the drift region extends down from the surface of the P type substrate, located under the field oxide and between the source region and the drain region; and
a P type doping layer formed in the P type substrate, a bottom of the P type doping layer being separated from the surface of the P type substrate by a second depth, wherein the second depth is larger than the first depth, the P type doping layer is formed in a region located below the first P type well and the drift region, the P type doping layer is fully located under a middle region between the first P type well and the drift region, and the P type doping layer is separated from the first P type well which comprises the source region.

2. The high voltage semiconductor device according to claim 1, wherein the P type doping layer is a P type buried layer.

3. The high voltage semiconductor device according to claim 1, wherein the P type doping layer comprises a plurality of P type doping segments separated from one another.

4. The high voltage semiconductor device according to claim 1, wherein a current path is formed between the source region and the drain region.

5. The high voltage semiconductor device according to claim 4, further comprising:
a gate structure formed above the current path between the source region and the drain region.

6. The high voltage semiconductor device according to claim 1, further comprising:
a second P type well formed in the P type substrate and adjacent to the high voltage N type well; and
a bulk region formed in the second P type well.

7. The high voltage semiconductor device according to claim 1, further comprising:
a P type top doping layer formed in the high voltage N type well and corresponding to where the drift region is located at; and
an N type doping layer formed in the P type top doping layer.

8. A high voltage semiconductor device, comprising:
a P type substrate;
a high voltage N type well formed in the P type substrate;
a first P type well formed in the high voltage N type well, a bottom of the first P type well being separated from a surface of the P type substrate by a first depth;
a N type heavily doping region and a P type heavily doping region formed in the P type substrate, wherein the N type heavily doping region is formed in the first P type well;
a field oxide formed on the P type substrate and located between the N type heavily doping region and the P type heavily doping region;
a drift region formed in the high voltage N type well, wherein the drift region extends down from the surface of the P type substrate, located under the field oxide and between the N type heavily doping region and the P type heavily doping region; and
a P type doping layer formed in the P type substrate, a bottom of the P type doping layer being separated from the surface of the P type substrate by a second depth, wherein the second depth is larger than the first depth, the P type doping layer is formed in a region located below the first P type well and the drift region, the P type doping layer is fully located under a middle region between the first P type well and the drift region, and the P type doping layer is separated from the first P type well which comprises the N type heavily doping region.

9. The high voltage semiconductor device according to claim 8, wherein the P type doping layer is a P+ buried layer.

10. The high voltage semiconductor device according to claim 8, wherein the P type doping layer comprises a plurality of P type doping segments separated from one another.

11. A high voltage semiconductor device, comprising:
a P type substrate;
a high voltage N type well formed in the P type substrate;
a first P type well formed in the high voltage N type well, a bottom of the first P type well being separated from a surface of the P type substrate by a first depth;
a source region and a drain region formed in the P type substrate, the source region is an N type heavily doping region and formed in the first P type well;
a field oxide formed on the P type substrate and located between the source region and the drain region;
a drift region formed in the high voltage N type well, wherein the drift region extends down from the surface of the P type substrate, located under the field oxide and between the source region and the drain region;
a gate structure formed above the high voltage N type well, wherein the source region is electrically connected to the gate structure; and
a P type doping layer formed in the P type substrate, a bottom of the P type doping layer being separated from the surface of the P type substrate by a second depth, wherein the second depth is larger than the first depth, the P type doping layer is formed in a region located below the first P type well and the drift region, the P type doping layer is fully located under a middle region between the first P type well and the drift region, and the P type doping layer is separated from the first P type well which comprises the source region.

12. The high voltage semiconductor device according to claim 11, wherein the P type doping layer is a P+ buried layer.

13. The high voltage semiconductor device according to claim 11, wherein the P type doping layer comprises a plurality of P type doping segments separated from one another.

* * * * *